United States Patent
Langer et al.

(10) Patent No.: US 9,713,248 B2
(45) Date of Patent: Jul. 18, 2017

(54) METHOD FOR PRODUCING A CIRCUIT BOARD

(71) Applicant: AT&S Austria Technologie & Systemtechnik Aktiengesellschaft, Leoben (AT)

(72) Inventors: Gregor Langer, Wölfnitz (AT); Mario Damej, Grafenstein (AT); Ferdinand Lutschounig, Ferlach (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/115,221

(22) PCT Filed: Jan. 21, 2015

(86) PCT No.: PCT/AT2015/050019
§ 371 (c)(1),
(2) Date: Jul. 28, 2016

(87) PCT Pub. No.: WO2015/113088
PCT Pub. Date: Aug. 6, 2015

(65) Prior Publication Data
US 2016/0353566 A1 Dec. 1, 2016

(30) Foreign Application Priority Data
Jan. 29, 2014 (AT) ............................. A 50058/2014

(51) Int. Cl.
*H05K 1/03* (2006.01)
*H05K 1/02* (2006.01)
(Continued)

(52) U.S. Cl.
CPC ........... *H05K 1/0274* (2013.01); *H01L 33/60* (2013.01); *H01L 33/62* (2013.01); *H05K 1/183* (2013.01);
(Continued)

(58) Field of Classification Search
CPC .......... H05K 1/207; H05K 3/46; H01L 21/00; H01L 21/02; H01L 21/28; H01L 23/48; H01L 23/498; C22C 21/00
(Continued)

(56) References Cited

U.S. PATENT DOCUMENTS 5,206,188 A * 4/1993 Hiroi ................ H01L 23/49827
257/E23.067
2004/0114652 A1 * 6/2004 Yoshikawa ........... H01S 5/0425
372/46.01
(Continued)

FOREIGN PATENT DOCUMENTS

JP 2003031914 A 1/2003
JP 2007189006 A 7/2007
(Continued)

OTHER PUBLICATIONS

International Search Report and Written Opinion for International Application No. PCT/AT2015/050019, Search completed Apr. 23, 2015, Mailed May 27, 2015, 9 Pgs.

*Primary Examiner* — Xiaoliang Chen
(74) *Attorney, Agent, or Firm* — KPPB LLP

(57) ABSTRACT

Method for the manufacture of a printed circuit board with at least one cavity for the accommodation of an electronic component, wherein the cavity walls exhibit a reflective, in particular mirrored reflector layer characterized by the following steps:
Provision of a printed circuit board,
Application of a temporary protective layer onto at least a section of the surface of the circuit board,
(Continued)

Figure 1A:
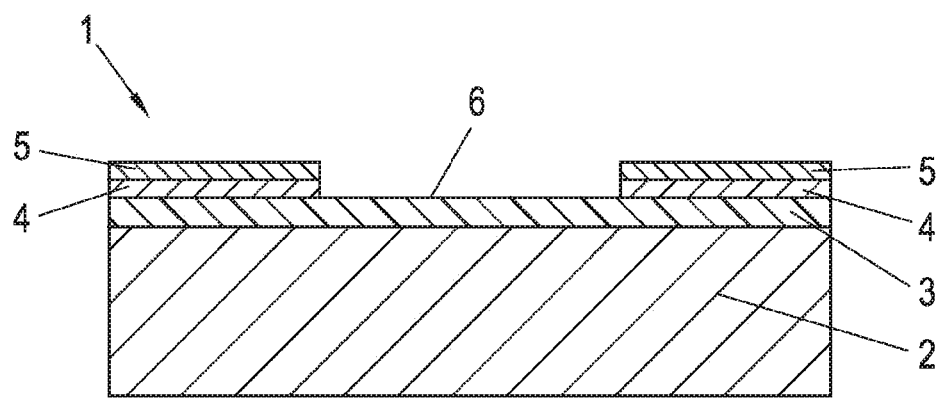
Figure 1B:
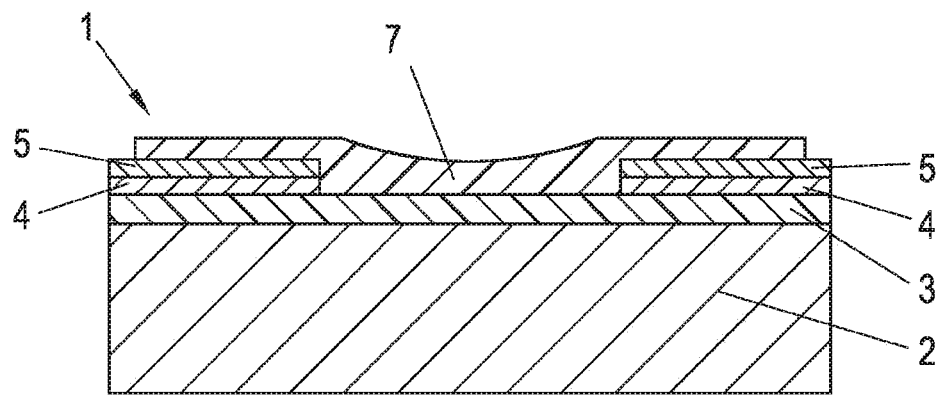
Figure 1C:
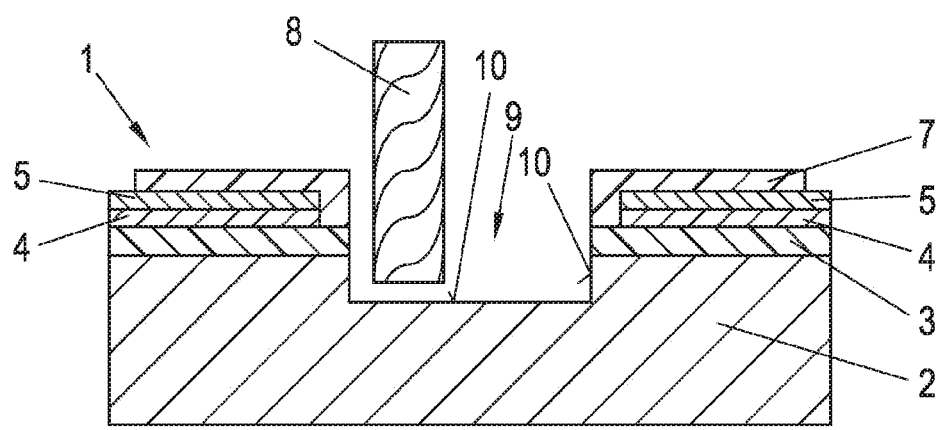

Creation of the cavity by way of penetration of the protective layer in the region of the cavity,
Application of the reflector layer,
Removal of the temporary protective layer.

17 Claims, 3 Drawing Sheets

(51) Int. Cl.
    *H01L 33/60*     (2010.01)
    *H05K 1/18*     (2006.01)
    *H05K 3/00*     (2006.01)
    *H01L 33/62*     (2010.01)
    *H05K 3/22*     (2006.01)

(52) U.S. Cl.
    CPC ......... *H05K 3/0026* (2013.01); *H05K 3/0044* (2013.01); *H05K 3/0055* (2013.01); *H05K 3/22* (2013.01); *H01L 2224/48091* (2013.01); *H01L 2224/48227* (2013.01); *H01L 2933/0058* (2013.01); *H01L 2933/0066* (2013.01); *H05K 2201/09036* (2013.01); *H05K 2201/10106* (2013.01); *H05K 2201/2054* (2013.01); *H05K 2203/308* (2013.01)

(58) Field of Classification Search
    USPC .................. 174/255; 257/99; 29/827; 385/14
    See application file for complete search history.

(56) References Cited

U.S. PATENT DOCUMENTS

| | | | |
|---|---|---|---|
| 2006/0222285 | A1* | 10/2006 | Minamio .......... H01L 27/14618 385/14 |
| 2008/0283491 | A1* | 11/2008 | Arai .................. B23K 26/0604 216/18 |
| 2009/0014749 | A1 | 1/2009 | Matsuda et al. |
| 2015/0007934 | A1* | 1/2015 | Gotzinger ............... F03B 3/121 156/247 |

FOREIGN PATENT DOCUMENTS

| | | |
|---|---|---|
| JP | 2012044102 A | 3/2012 |
| WO | 2010085830 A1 | 8/2010 |
| WO | 2015113088 | 8/2015 |

\* cited by examiner

METHOD FOR PRODUCING A CIRCUIT BOARD

CROSS REFERENCE TO RELATED APPLICATIONS

This application is a national stage of PCT/AT2015/050019, filed Jan. 21, 2015, which application claims priority to Austrian Application No. A 50058/2014, filed Jan. 29, 2014, the disclosures of which are hereby incorporated by reference in their entireties.

The present invention pertains to a method for the manufacture of a printed circuit board with at least one cavity for the accommodation of an electronic component, wherein the walls of the cavity exhibit a reflecting, in particular mirroring, reflector layer as well as a printed circuit board manufactured according to this method.

Printed circuit boards are used in the electronics industry for the highly integrated interconnecting of electronic components in highly confined space. In addition to the mechanical support function, printed circuit boards—due to the high degree of integration required to meet the requirements of the miniaturization of electronic devices—must fulfill a number of additional functions. For example, the heat distribution in the printed circuit board as well as the heat dissipation from the printed circuit board require high attention. Many applications use powerful LED components, so-called Power-LED's which themselves are increasingly integrated into cavities in the printed circuit board. The integration of an LED in the circuit board allows good dissipation of the heat produced by the LED in the circuit board, where the heat can be distributed efficiently in order to avoid heat damage in the LED area as much as possible. This, however, has the disadvantage that due to the spatial enclosure of the LED by the cavity walls, the efficiency of the LED regarding the yield of light is reduced.

It would therefore be desirable to provide the cavities or the cavity walls for LED applications with a highly reflective and in particular mirroring reflector layer. The problem with this, however, is the fact that all of the processes brought into consideration for the purposes of industrial production of printed circuit boards lead to a more or less unspecific application of the materials forming the reflector surfaces, such as coatings, pigments and/or metals, onto the printed circuit board. Such coatings and pigments are, for example, sprayed on, so that at least the areas surrounding the cavities are contaminated with such coating. This is especially problematic in the case of printed circuit boards for LED applications since the contacts of the LED-chips are usually attached by wire bonding methods, which methods require a special surface treatment of the circuit board in order to provide the respective bonding surfaces. For the bonding, these bonding surfaces must on one hand remain free of dirt or even overlays of other layers and, on the other hand, are mechanically very sensitive, such that these areas, after having been created, should better remain largely untouched.

The invention is therefore based on the objective to provide a method allowing selective application of reflector layers onto the cavity walls, without damaging conductor path structures, in particular bonding surfaces.

This objective is achieved with a method of the type mentioned above, which is characterized by the following steps:

Provision of a printed circuit board,
Application of a temporary protective layer to at least a section of the surface of the printed circuit board,
Creation of the cavity by way of penetration of the protective layer in the area of the cavity,
Application of the reflector layer
Removal of the temporary protective layer.

According to the present invention, a printed circuit board is prior to the creation of the cavity and therefore also prior to the mirror-coating of the cavity provided with a temporary protective layer designed to protect conducting paths and in particular sensitive boding surfaces from dirt and damages. Since the temporary protective layer is penetrated by the corresponding tool as the cavity is being created, the temporary protective layer extends exactly to the edge of the cavity, so that in fact only the cavity walls are coated with the reflector layer. After completion of the mirroring cavities, the temporary protective layer is removed, leaving the sensitive surfaces again exposed and available for the further processing of the printed circuit board. Normally, this is followed by further processing in the form of populating the mirroring cavities with the LED chips, which are connected by way of the wire bonding method.

In this context, the inventive method is preferably further developed in that a printed circuit board with structured bonding surfaces for electronic components is provided. Even though bonding surfaces for electronic components like LED-chips, for example, are in comparison to conventional conducting paths of copper relatively sensitive and especially sensitive to mechanical influences, they are able to easily withstand the application and the removal of the temporary protective layer, as will be used in the present invention, and can be used after the removal of the temporary protective layer for the contacting by means of the wire bonding method.

As already mentioned above, a printed circuit board develops due to the high level of integration of electronic components, which in their entirety inherently generate a certain amount of waste heat, and with the use of high-powered LED-chips especially large amounts of heat, which in particular in the case of said LED-chips occur very selectively, and which therefore, in order to avoid temperature peaks in the printed circuit board, must be distributed effectively to ensure an acceptable lifetime of the printed circuit board. According to a preferred embodiment of the present invention, the inventive method is therefore preferably developed further in that the printed circuit board is provided in the form of an IMS printed circuit board. The abbreviation IMS stands for Insulated Metal Substrate and designates starting materials for printed circuit boards, in which an insulating layer consisting, for example, of epoxy resin filled with thermally conductive particles (e.g. aluminum oxide, aluminum nitride) is situated between a thin metal layer from which the conductor paths are formed and a relatively thick metal plate, with said metal plate being able to very effectively distribute heat across the entire surface of the plate. The use of an IMS printed circuit board for the accommodation of LED chips in cavities therefore represents in view of the distribution of heat an extremely economical option, whereas however in cases, in which the LED-chip-containing cavity is not mirroring as prescribed by this invention, the result is a relatively low yield of light. This is due to the fact that the sectional faces of the cavity, i.e. the cavity walls, which usually consist of aluminum or copper, have a relative low reflectivity. This disadvantage of using an IMS printed circuit boards to accommodate LED chips in cavities is thus optimally compensated by the present invention, since the per se poorly reflecting or not at all reflecting cavity walls can be equipped with a respective reflector layer without damaging any potential bonding surfaces on the surface of the printed circuit board during the manufacture of the reflector layer.

Since the present invention allows the application of a highly effective reflector layer to the cavity walls, special measures to optimize the reflectivity of the cavity walls are not necessary. According to a particularly simple and therefore preferred embodiment of the present invention, a procedure can be used in which the step of creating the cavity comprises the milling of the printed circuit board with a milling head. The milling of the circuit board with a milling head can be automated in an excellent manner, wherein the milling head, which is capable of milling the circuit board, and in particular an IMS printed circuit board, inherently also permeates the temporary protective layer with ease, thereby creating a clear cut surface of the protective layer, thus limiting the reflector layer to the cavity walls in an optimal manner.

According to a preferred alternative embodiment of the present invention, however, another option to proceed is the provision of the printed circuit board in the form of a printed circuit board made of a prepreg material. Such prepreg materials such as FR4, have a much lower thermal conductivity than the aforementioned IMS printed circuit boards, but are widely used and offer advantages over IMS printed circuit boards in terms of a relatively easy feasibility of multi-layer printed circuit board assemblies, which in turn accommodates electronics industry's desired miniaturization of printed circuit boards. The inventors of the present method according to the invention have found that this method can also be readily applied to types of printed circuit boards made of prepreg materials.

In this case, it is preferable for the step of forming the cavity to comprise the cutting of the printed circuit board with a laser beam. The cutting of such printed circuit boards with a laser beam is a well-tested standard method in the PCB industry, and can be easily implemented for the manufacture of cavities. Prepreg printed circuit boards, for example, are cut with CO2 lasers, wherein the depth of the laser's penetration into the printed circuit board can be controlled by the provision of a stop layer of copper at the desired depth of the printed circuit board. Accordingly, the laser is not required to cut all the way through the printed circuit board but only up to a certain depth, which would make the laser cutting method the method of choice for the creation of a cavity in terms of an excavation with a bottom in the printed circuit board.

In order to favor the formation of a cavity in such a prepreg circuit board, the invention according to a preferred embodiment is further developed in that the circuit board exhibits an adhesion-reducing layer above the laser stop layer. Now, when the laser cuts toward the laser stop layer and cuts out a nearly cuboid-shaped piece of the printed circuit board, this cuboid-shaped piece can, due to the adhesion-reducing layer, especially easily removed from the volume of the printed circuit board. In printed circuit board technology, such adhesion-reducing layers or adhesion-reducing materials are known and consist in particular of Al, Mg, Ca, Na or Zn soaps together with a binder and a solvent. These materials are already standard for the removal of printed circuit board layers that have been cut free from the underlying printed circuit board layers. The use of an adhesion-reducing layer is known from WO 2010/085830 A1, for example.

The temporary protective layer, which is essential to the present invention, can be applied to the printed circuit board in various ways. According to a preferred embodiment of the present invention, it is however provided that as temporary protective layer, a self-adhesive film is applied, in which case the self-adhesive film can be laminated to the printed circuit board at low pressure and normal processing temperature only.

Preferred is for the self-adhesive film to be a film based on polyethylene with an adhesive layer based on rubber. Such films are used among others as laser protective films and are known, for example, under the name of Laser Light Guard 3100H3 Nitto Denko. The film PF 32 C of the Poli-Film Company also fits this category.

According to an alternative preferred embodiment of the present invention, the self-adhesive film is a film based on PVC with an adhesive layer based on acrylate. Such films are known as surface protection films, which are characterized by excellent deformation properties and are used to protect metal surfaces in molding or bending processes. In this category, the film SPV 224P from Nitto Denko should be mentioned, which is a PVC film with pressure sensitive acrylic adhesive and which provides lubricating properties for milling.

According to a further preferred embodiment of the present invention, the adhesive film is a film based on polyethylene with an adhesive layer based on acrylate, among them, for example, film PF 13 of the Poli-Film Company.

All of the above-mentioned films are already standard in the processing of printed circuit boards, and the professional is familiar with their handling.

Alternatively to the above-mentioned self-adhesive films, however, an embodiment of the present invention is conceivable in which a temporary protective coating based on silicone is applied, which can be applied in a thicker layer and mechanically peeled off after further processing of the printed circuit board, i.e. after the mirroring cavities have been created.

All of the aforementioned options for the provision or application of a temporary protective layer have in common that the temporary protective layer can be removed mechanically by peeling since chemical removal would corrode the reflector layer in the cavity and/or the protected surfaces, in particular the bonding surfaces.

A preferred procedure for the preparation of the reflector layer is for the reflector layer to be made of a coating chosen from the group of epoxy coatings and acrylate coatings. Epoxy and acrylate coating are structured similarly to the solder resists known in the PCB industry and may be filled with white pigments or fillers. Therefore on one hand, known white solder resists may be used, e.g. coatings from Taiyo or Huntsman (Probimer 77) or specifically prepared for the forming of reflector layers. Important is, however, for the coating systems to be stable against UV light and thermal load and that they must not turn yellow. These coatings may be applied by spraying, where they are finely atomized and can easily cover the cavity walls by way of instructed coating.

Alternatively, the invention may be preferably developed such that the reflector layer may be applied to the printed circuit board as a metal layer selected from the metals in the group consisting of Al, Ag and Rh. On the surface, these metal layers create a mirror, resulting in a directed reflection of the incident light. The best reflection in the visible wavelength range is achieved with silver. For cost reasons, however, aluminum is often used, which also exhibits acceptable reflective properties. Silver can be chemically deposited on metal layers, is, however, not stable in the atmosphere due to the formation of silver sulfide layers. Therefore, in the present invention, silver reflector layers are usually coated with rhodium, which forms stable protective layers, however, does not hinder the reflection of the light. The rhodium is applied galvanically.

In order to further improve the reflective properties of the reflector layer, thin transparent oxide layers may be applied to said metal layers. The invention is therefore preferably developed further to include an additional layer selected from the group consisting of silica and alumina. This may be done by means of physical vapor deposition in a vacuum (PVD coating; PVD=Physical Vapor Deposition).

A particularly preferred procedure for the depositing of a reflector layer provides for the step of depositing the reflector layer to consist of the following steps:

Application of a lacquer coating of a gloss varnish within the cavity

Application of a reflection layer of metal onto the glossy coating

Application of a hexamethyldisiloxane-based protective layer onto the reflection layer.

Such method is already being used for the manufacture of reflectors, for example for vehicle headlights with particularly high-quality optical surfaces, and may be obtained for example under the trade name of ALUNOVA® of the OTEC Company and implemented for the manufacture of printed circuit boards. The glossy coating is used to compensate for unevenness of the surface, like the milled edge of the cavity and to mold a smooth surface as well as to provide better adhesion for the subsequent reflection layer, which is usually made of aluminum. These glossy coating systems may be applied by spraying or by depositing via anodic electrophoretic dip coating. The application of the highly reflective metal layer, preferably made of pure aluminum, is done in a vacuum by vapor deposition or magnetron sputtering. The hexamethylsiloxane-based protective layer is applied to protect the aluminum from external influences and especially corrosion, and provides a long-term stable, smudge-resistant organic silicon protective layer with a high chemical barrier effect. This layer is non-iridescent, almost non-porous, and exhibits an extremely low level of light absorption. The hexamethyldisiloxane is deposited by deposition in a mid-frequency vacuum process by plasma polymerization and creates a glass-like coating layer on the surface of the body to be coated.

According to a preferred embodiment of the present invention, it is provided that during the step of the creation of the cavity, distance is kept to existing conductor paths and bonding surfaces on the printed circuit board, which is essential in particular when the reflector layer is made of an electrically conductive material. In this case, the metallic and thus conducting reflector layer must not come into contact with the conductor paths or bonding surfaces of the circuit board, as this would lead to an electrical short circuit. If, according to this preferred embodiment, the cavity is made with a certain distance from existing conductor paths or bonding surfaces of the circuit board, in order to apply—as provided for in the present method according to the invention—the reflector layer in the presence of the temporary protective layer, it is ensured that after removal of the temporary protective layer no such short-circuit is formed as the protective layer accordingly overlaps or projects beyond the conductor paths or bonding surfaces.

In the following, the invention is explained in reference to an embodiment schematically shown in the drawing. In this drawing show FIGS. 1a-1f, a first preferred embodiment of the method according to the invention and FIGS. 2a-2c, an alternative preferred embodiment of the method according to the invention.

Figure 1D:
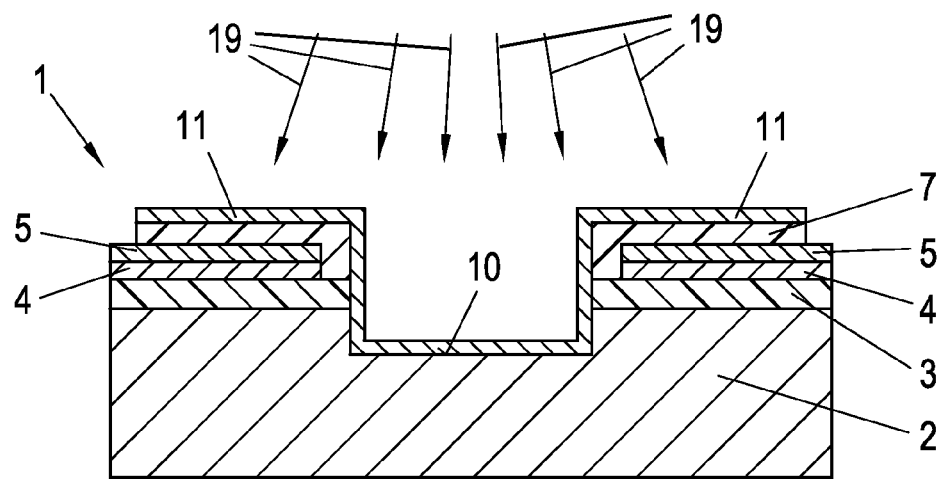
Figure 1E:
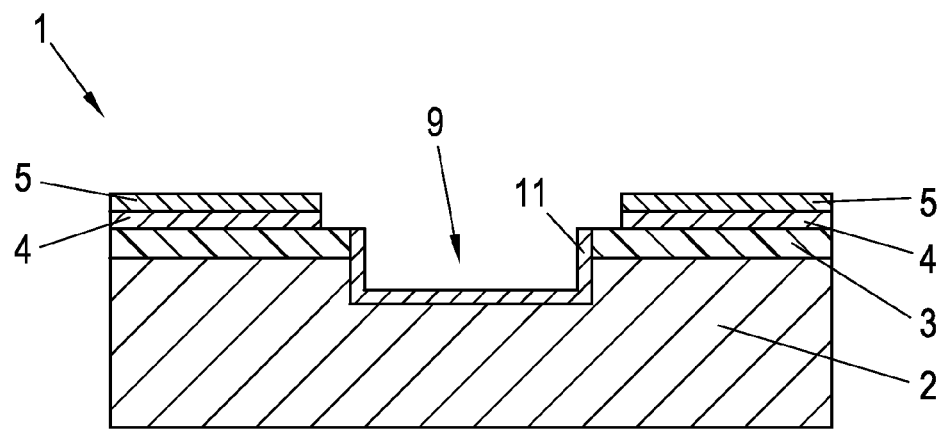
Figure 1F:
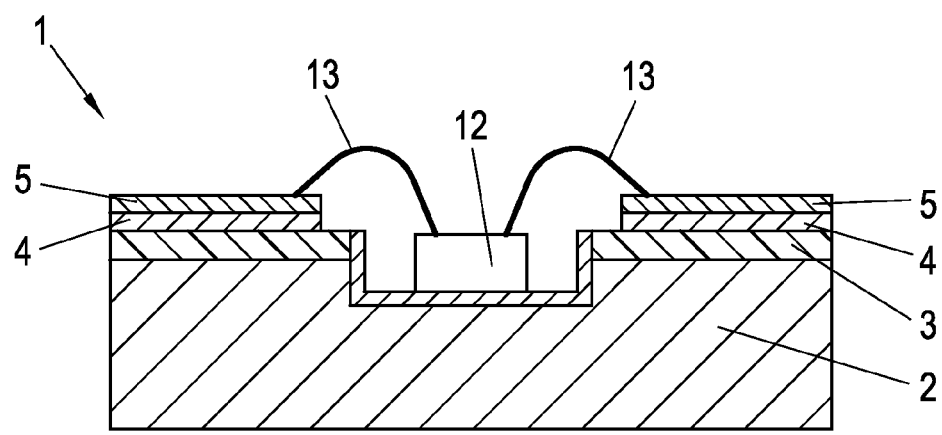

In FIG. 1a), a circuit board designated as 1, wherein the printed circuit board 1 in the present case is an IMS printed circuit board (Insulated Metal Substrate). The IMS printed circuit board 1 is characterized by a relatively thick metal substrate 2, which may be made of copper or aluminum and may exhibit a thickness of at least 50 microns to up to a few millimeters. The substrate layer 2 is followed by an insulating layer 3 usually made of an insulating resin system filled with thermally conductive particles, for example epoxy resin. Configured on this insulating layer 3 are conductor paths 4 respectively as well as gold surfaces 5, which serve as bonding surfaces. The printed circuit board 1 is thus ready to receive the LED chips, which could, for example, be attached at position 6, wherein the contacting of an LED chip could be maintained through the bonding surfaces 5. In the context of the present invention, in which a cavity is to be created, a temporary protective layer 7 is now applied to the printed circuit board 1 (FIG. 1b) which covers the bonding surfaces 5. The temporary protective layer 7 may also cover the conductor paths 4 made of copper, if they would not be covered, as in the present case, by gold surfaces 5. From FIG. 1c) can now be obtained that in the printed circuit board that has been prepared in accordance with FIG. 1b) a cavity 9 could be created by means of a milling head 8, for example. The cavity 9 exhibits after this process step relatively poorly reflecting cavity walls 10. In FIG. 1d), the reflector layer 11 is now applied, as symbolized by the group of arrows 19. It can be determined that the reflector layer 11 covers the surfaces of the temporary protective layer 7 as well as the cavity walls 10. After removal of the temporary protective layer 7 (FIG. 1e), the result is a printed circuit board with a mirroring cavity 9, wherein the reflector layer 11 lines the interior of the cavity 9 only. It is now possible to insert into the mirroring cavity 9 an LED chip 12, which via bonding wires 13 can be connected to the bonding surface 5 (FIG. 1f).

Figure 2A:
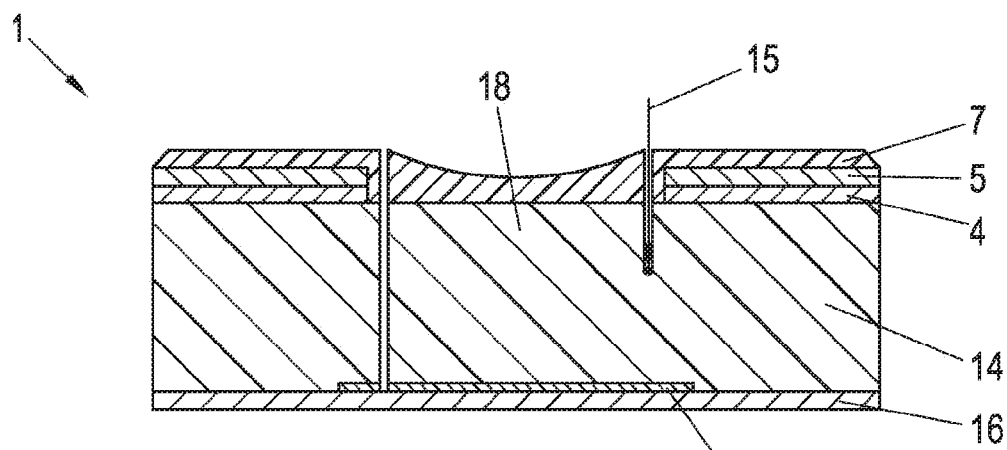
Figure 2B:
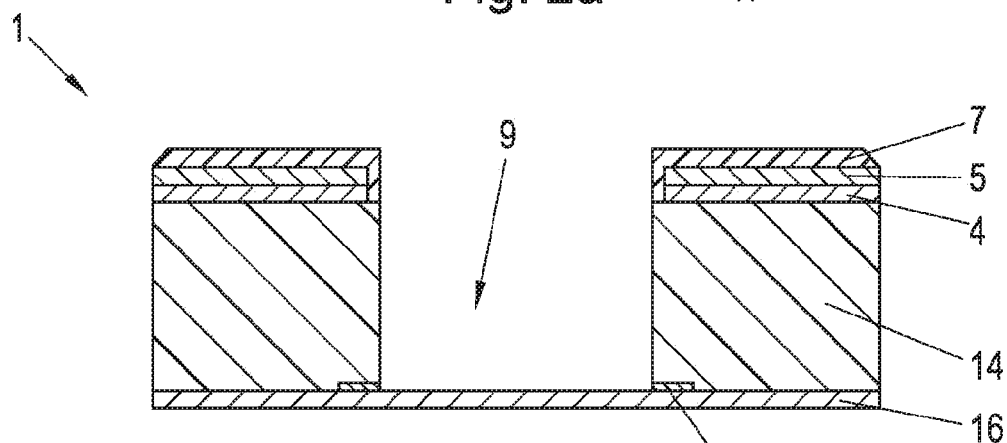
Figure 2C:
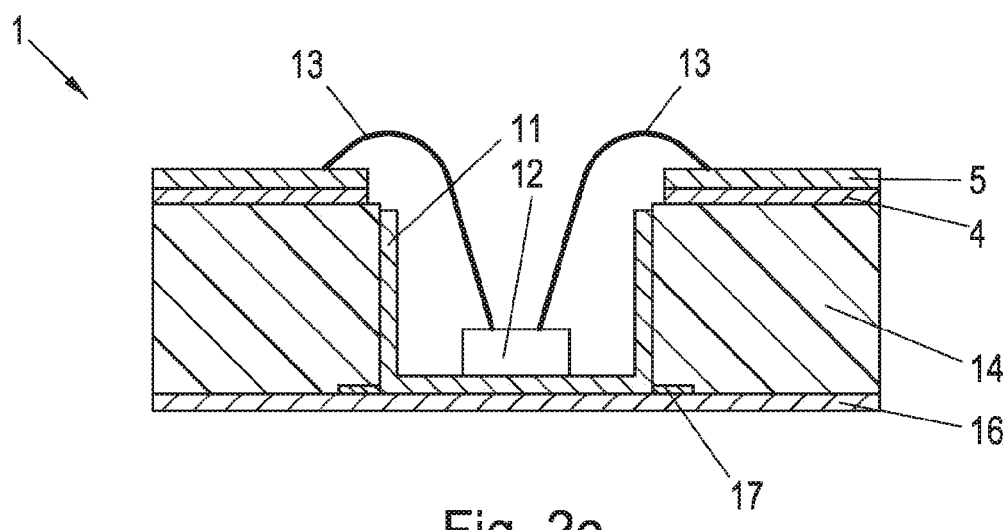

FIG. 2a, on the other hand, shows a printed circuit board 1 which, in this case, is not an IMS printed circuit board but a printed circuit board made of a well-known, glass fiber reinforced epoxy resin (e.g. FR4). The FR4 layer or prepreg layer is in this case designated as 14, where again copper layers 4 and bonding surfaces 5 are present on the printed circuit board 1. A laser beam symbolized by numeral 15 cuts both through the protective layer 7 as well as the prepreg layer 14, which is an insulating layer, until it impinges on a laser stop layer 16 made of copper, for example. An adhesion-reducing layer designated as 17, facilitates the removal of the plug 18 cut by the laser beam 15 (FIG. 2b). The status in FIG. 2b basically corresponds to the status of the printed circuit board in FIG. 1c) and it is obvious that further processing and the creation of the mirrored cavity analogous to method steps 1d) to 1f) can proceed, ultimately yielding a printed circuit board assembly as can be seen in FIG. 2c).

It is obvious that the present invention can be used not only in combination with the LED chip, but may also be beneficial for other optoelectronic components, such as for photodiodes or laser diodes, possibly combined with a light conversion agent.

What is claimed is:

1. The present Invention pertains to a method for the manufacture of a printed circuit board with at least one cavity for the accommodation of an electronic component, with the walls of the cavity exhibiting a reflecting, in particular mirrored, reflector layer, characterized by the following steps:

Provision of a printed circuit board,

Application of a temporary protective layer onto at least a partial section of the surface of the printed circuit board, Creation of the cavity by way of penetration of the protective layer in the region of the cavity, Application of the reflector layer, Removal of the temporary protective layer.

2. Method according to claim 1 characterized in that a printed circuit board with structured bonding surfaces is provided for electronic components.

3. Method according to claim 1 characterized in that provided as the printed circuit board is an IMS printed circuit board.

4. Method according to claim 1 characterized in that the step of creating the cavity comprises the milling of the printed circuit board with a milling head.

5. Method according to claim 1 characterized in that provided as printed circuit board is a printed circuit board made of a prepreg material.

6. Method according to claim 5 characterized in that the step of creating the cavity comprises the cutting of the printed circuit board with a laser beam.

7. Method according to claim 1 characterized in that the circuit board exhibits an adhesion-reducing layer arranged above a laser stop layer.

8. Method according to claim 1 characterized in that applied as temporary protective layer is a self-adhesive film.

9. Method according to claim 1 characterized in that the self-adhesive film is a polyethylene-based film with a rubber-based adhesive layer.

10. Method according to claim 8 characterized in that the self-adhesive film is a PVC-based film with an acrylate-based adhesive layer.

11. Method according to claim 8 characterized in that the self-adhesive film is a polyethylene-based film with an acrylate-based adhesive layer.

12. Method according to claim 1 characterized in that applied as temporary protective layer is a silicone-based coating.

13. Method according to claim 1 characterized in that the reflector layer is a coating material selected from the group consisting of epoxy coatings and acrylate coatings formed.

14. Method according to claim 1 characterized in that the reflector layer is applied as a metal layer selected from the metals of the group consisting of Al, Ag and Rh to the printed circuit board.

15. Method according to claim 14 characterized in that an additional layer selected from the group consisting of silicon oxide and alumina is applied.

16. Method according to claim 1 characterized in that the step of the application of the reflector layer comprises the following steps:

Application of a lacquer coating layer of a gloss varnish within the cavity,

Application of a reflection layer of metal onto the gloss varnish,

Application of a hexamethylsiloxane-based protective layer onto the reflection layer.

17. Method according to claim 1 characterized in that during the step of creating the cavity distance to existing conductor paths and bonding surfaces of the printed circuit board is maintained.

\* \* \* \* \*